US010586586B1

(12) United States Patent
Lee et al.

(10) Patent No.: US 10,586,586 B1
(45) Date of Patent: Mar. 10, 2020

(54) APPARATUSES INCLUDING THRESHOLD VOLTAGE COMPENSATED SENSE AMPLIFIERS AND METHODS FOR COMPENSATING SAME

(71) Applicant: MICRON TECHNOLOGY, INC., Boise, ID (US)

(72) Inventors: Kyuseok Lee, Boise, ID (US); Sangmin Hwang, Boise, ID (US); Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/183,594

(22) Filed: Nov. 7, 2018

(51) Int. Cl.
*G11C 11/4091* (2006.01)
*G11C 11/4074* (2006.01)
*G11C 7/06* (2006.01)
*G11C 11/408* (2006.01)

(52) U.S. Cl.
CPC ............ *G11C 11/4091* (2013.01); *G11C 7/06* (2013.01); *G11C 11/4074* (2013.01); *G11C 11/4085* (2013.01); *G11C 2207/002* (2013.01)

(58) Field of Classification Search
CPC ... G11C 11/4091; G11C 7/06; G11C 11/4074; G11C 11/4085; G11C 2207/002

USPC ......................................................... 365/205
See application file for complete search history.

(56) References Cited

U.S. PATENT DOCUMENTS

| 7,317,646 | B2 * | 1/2008 | Yoon ................... G11C 11/4097 |
| | | | 365/205 |
| 7,355,913 | B2 * | 4/2008 | Kang ....................... G11C 7/12 |
| | | | 365/203 |
| 7,359,268 | B2 * | 4/2008 | Kang ................... G11C 11/4096 |
| | | | 365/190 |
| 9,202,531 | B2 | 12/2015 | Seo |
| 10,074,408 | B2 * | 9/2018 | Seo .......................... G11C 7/08 |
| 2006/0181917 | A1 * | 8/2006 | Kang ...................... G11C 7/065 |
| | | | 365/149 |
| 2006/0221665 | A1 * | 10/2006 | Kang ................... G11C 11/4096 |
| | | | 365/149 |
| 2019/0180811 | A1 * | 6/2019 | Kim ....................... G11C 5/025 |
| 2019/0237114 | A1 * | 8/2019 | Won .................... G11C 11/4099 |

* cited by examiner

*Primary Examiner* — Fernando Hidalgo
(74) *Attorney, Agent, or Firm* — Dorsey & Whitney LLP (57) ABSTRACT

Apparatuses including threshold voltage compensated sense amplifiers and methods for compensating same are disclosed. An example threshold voltage compensated sense amplifier according to the disclosure includes isolation transistors, equalization transistors and precharge transistors that are used to provide threshold voltage compensation.

20 Claims, 11 Drawing Sheets

APPARATUSES INCLUDING THRESHOLD VOLTAGE COMPENSATED SENSE AMPLIFIERS AND METHODS FOR COMPENSATING SAME

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be sensed and amplified by a sense amplifier to indicate the value of the data state stored in the memory cell.

Conventional sense amplifiers are typically coupled to a pair of complementary digit lines to which a large number of memory cells (not shown) are connected. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line does not and serves as a reference for the sensing operation. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

The digit lines are precharged during a precharge period to a precharge voltage, such as one-half of a supply voltage, so that a voltage difference can be accurately sensed and amplified during a subsequent sensing operation. However, due to random threshold voltage mismatch of transistor components, the digit lines may be abruptly imbalanced before a voltage change is sensed and amplified on one of the digit lines. Such threshold voltage deviations can cause the sense amplifier to erroneously amplify input signals in the wrong direction. There is, therefore, a need for a sense amplifier design that reduces threshold voltage mismatches.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
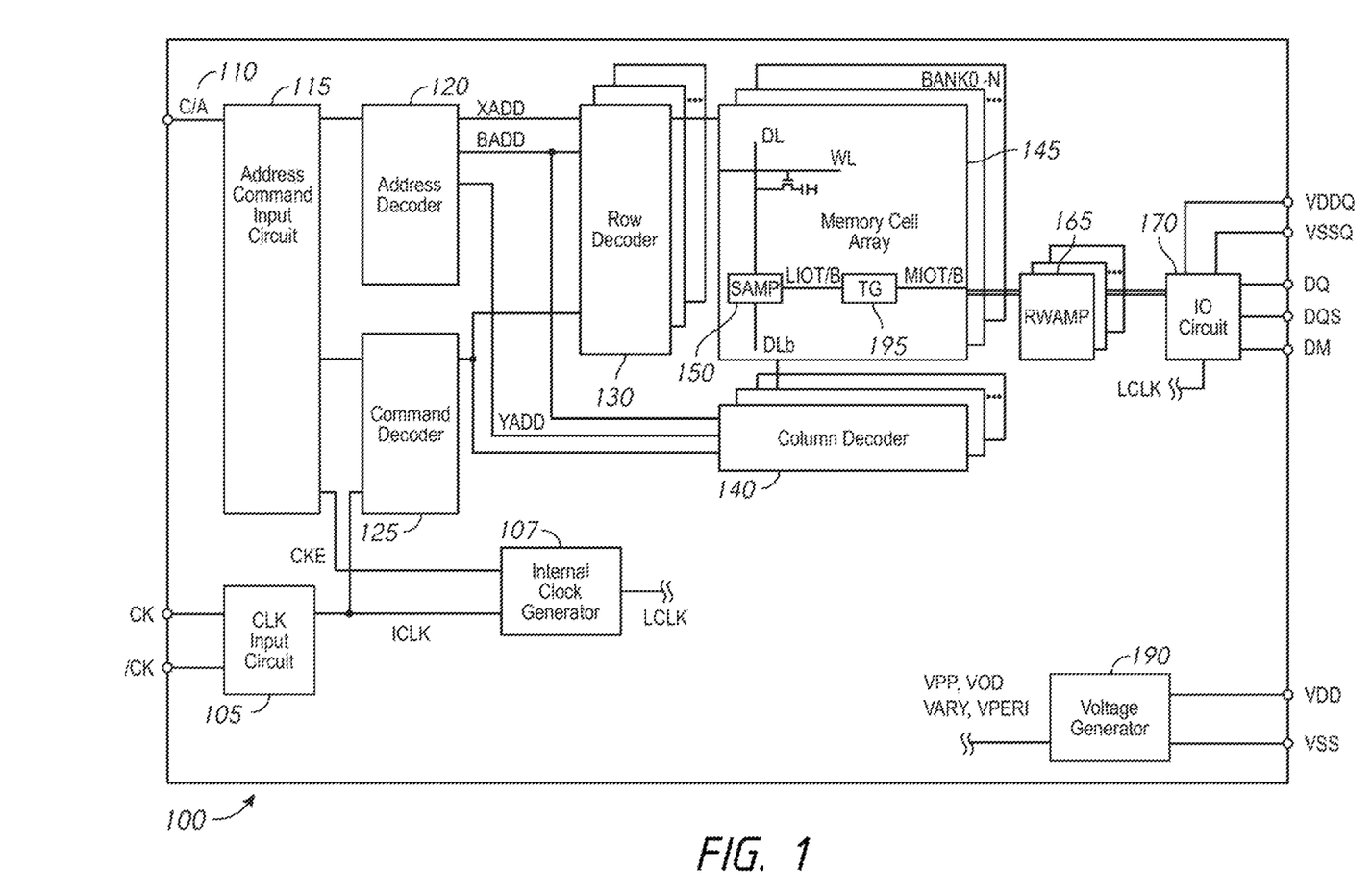
FIG. 1 is a schematic block diagram of a semiconductor device according to an embodiment of the disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190. The semiconductor device 100 may include a plurality of external terminals including address and command terminals coupled to command/address bus 110, clock terminals CK and/CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL, and a plurality of memory cells MC arranged at intersections of the plurality of word lines WL and the plurality of digit lines DL. The selection of the word line WL for each bank BANK0-N is performed by a corresponding row decoder 130 and the selection of the digit line DL is performed by a corresponding column decoder 140. The plurality of sense amplifiers 150 are located for their corresponding digit lines DL and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof. In some examples, the tRCD for the semiconductor device 100 may involve operations of the row decoders 130, the column decoders 140, and circuitry of the memory cells array 145 of each of the plurality of banks BANK0-N (e.g., including the plurality of sense amplifiers 150 and the transfer gates TG 195).

In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variances in the performance between circuit components of the sense amplifiers 150 (e.g., due to process, voltage, and temperature (PVT) variance) may reduce operational reliability of the semiconductor device 100. To mitigate effects of these variations, compensating for some of these threshold voltage Vt differences may include, before activating the sense amplifier 150 to sense data, biasing digit lines DL and DLb coupled to the sense amplifiers 150 using internal nodes of the sense amplifier 150 that are configured to provide sensed data to an output (e.g., gut nodes). The bias of the digit lines DL and DLb may be based on threshold differences between at least two circuit components (e.g., transistors) of the sense amplifier 150. While compensating for threshold voltage Vt differences between circuit components within the sense amplifier 150 may improve reliability.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and generate various internal command signals. The internal command signals may be used to control operation and timing of various circuits of the semiconductor device 100. For example, the internal command signals may include row and column command signals to control circuits to perform access operations to selected word lines and digit lines, such as a read command or a write command.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when the write command is issued and a row address and a column address are timely supplied with the write command, and then the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VBLP, NSA_BIAS, VARY, VPERI, and the like based on the power supply voltages VDD and VSS. The internal voltage VPP is mainly used in the row decoder 130, the internal voltages VOD, VBLP, NSA_BIAS, and VARY are mainly used in the sense amplifiers 150 included in the memory cell array 145, and the internal voltage VPERI is used in many other circuit blocks. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
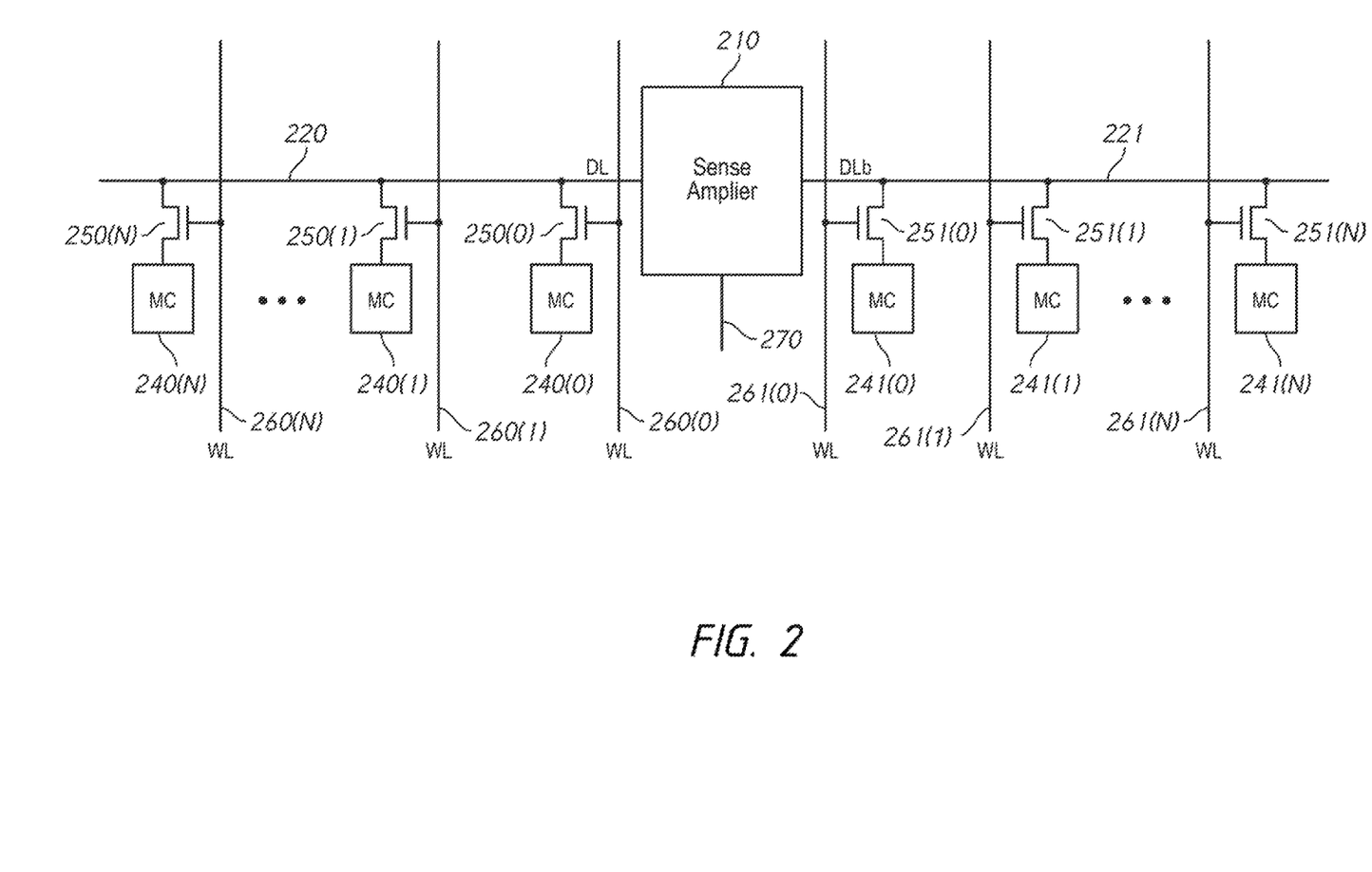
FIG. 2 is a schematic diagram of a sense amplifier and a pair of complementary digit lines according to an embodiment of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line DLb 221. Wordlines WL 260(0)-(N) may control which of the memory cells 240(0)-(N) is coupled to the digit line DL 220 by controlling a gate of a respective access device 250(0)-(N). Similarly, wordlines WL 261(0)-(N) may control which of the memory cells 241(0)-(N) is coupled to the digit line DLb 221 by controlling a gate of a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In some examples, the memory 200 may operate in general phases or modes. A first phase (e.g., precharge phase) may be initiated in response to a precharge command PRE. During the precharge phase, the wordlines WL 260(0)-(N) and 261(0)-(N) may be set to an inactive state, and in response, the access devices 250(0)-(N) and 251(0)-(N) may all be disabled. Further, the digit lines DL 220 and DLb 221 and internal nodes of the sense amplifier 210 that are configured to provide a sensed data state to an output (e.g., gut nodes) may be precharged to and held at a precharge voltage, such as a digit line precharge voltage VBLP, until transitioning to a second phase.

In some examples, sense amplifier 210 includes threshold voltage compensation circuitry that compensates for threshold voltage mismatches between components of the sense amplifier 210 during a threshold voltage compensation phase. To perform the threshold voltage compensation, the sense amplifier 210 may, during a threshold voltage compensation phase, precharge or bias the digit lines DL 220 and DLb 221 such that a voltage difference between the digit line DL 220 and the DLb 221 is approximately equal to threshold voltage differences between at least two circuit components of the sense amplifier 210. In some examples, the threshold voltage difference may be based on threshold voltages of transistors of the sense amplifier 210. Compensating for threshold voltage Vt differences between circuit components within the sense amplifier 210 may improve reliability.

A third phase is a sense amplifier activation phase. During the activation phase, a wordline WL of the wordlines WL 260(0)-(N) and 261(0)-(N) may be set to an active state, and, in response, an access device of the access devices 250(0)-(N) and 251(0)-(N) may be enabled to couple a respective memory cell of the memory cells 240(0)-(N) and 241(0)-(N) to one of the digit lines DL 220 and DLb 221. The sense amplifier 210 may be configured to perform a sense operation to sense a data state of the coupled memory cell. That is, during a sense operation, a data state stored by the coupled memory cell is sensed and amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary voltage level during the sense operation. After the sense operation, the circuitry of the memory 200 may remain in the activation phase or may transition back to the precharge phase in response to a precharge command PRE.

Similarly, a memory cell of the memory cells 241(0)-(N) is coupled to the digit line DLb 221 through the respective access device 251(0)-(N) in response to a respective word line 261(0)-(N) becoming active. A data state stored by the memory cell is sensed and amplified by the sense amplifier 210 to drive the digit line DLb 221 to a high or low voltage level corresponding to the sensed data state. The other digit line DL 220 is driven to the complementary voltage level (e.g., the high voltage level is complementary to the low voltage level and the low voltage level is complementary to the high voltage level) during the sense operation.

During the threshold voltage compensation operation, the gut nodes of the sense amplifier 210 may be isolated from the digit lines DL 220 and DLb 221 in response to the control signals 270 (e.g., from a decoder circuit). In some examples, the control signals 270 may configure the sense amplifier 210 to isolate the gut nodes from the digit lines DL 220 and DLb 221 during the threshold voltage compensation phase. For example, during the threshold voltage compensation phase, the gut nodes of the sense amplifier 210 may be coupled to each other, to the digit lines DL 220 and DLb 221, and to a precharge voltage (e.g., VBLP) to precharge each to the precharge voltage. After the gut nodes of the sense amplifier 210 and the digit lines DL 220 and DLb 221 are at the VBLP voltage, the control signals 270 may configure the sense amplifier 210 to isolate the gut nodes from the digit lines DL 220 and DLb 221. A voltage difference between 220 and 221 may then be developed at the digit lines DL 220 and DLb 221 to provide threshold voltage compensation, as previously described.

Figure 3:
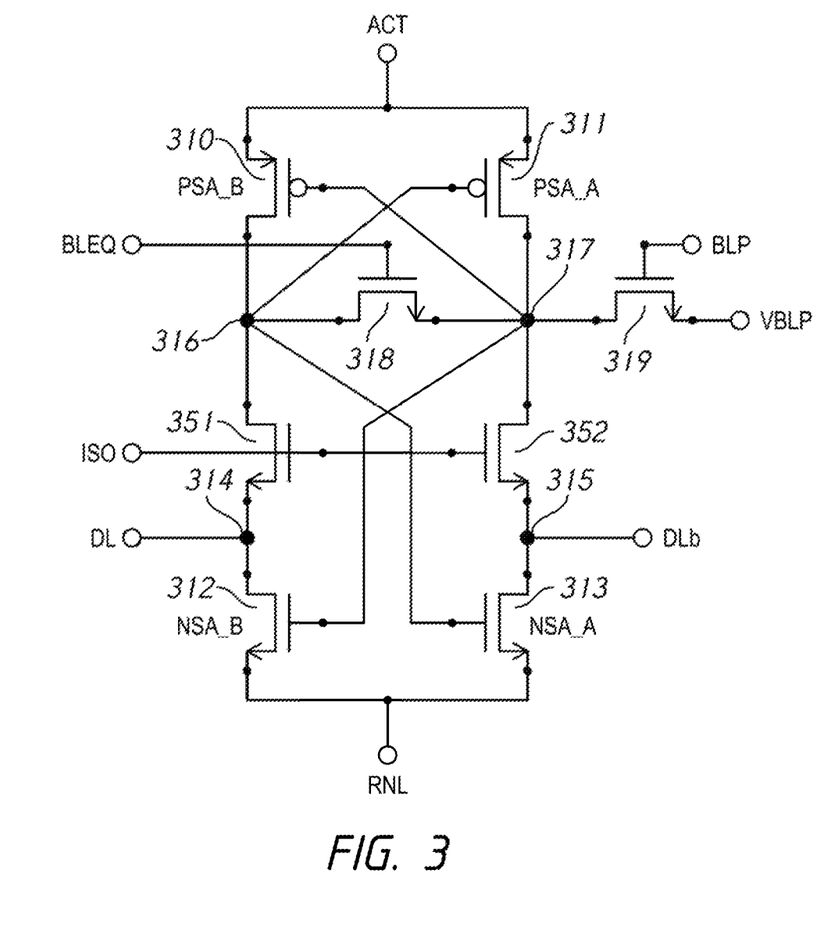
FIG. 3 is a schematic diagram of a sense amplifier according to an embodiment of the disclosure.

FIG. 3 is a schematic diagram of a sense amplifier 300 in accordance with an embodiment of the disclosure. The sense amplifier 300 may be included in one or more of the sense amplifiers 150 of FIG. 1 and/or the sense amplifier 210 of FIG. 2.

The sense amplifier 300 includes first type of transistors (e.g. p-type field effect transistors (PFET)) 310 and 311 having drains coupled to nodes 316 and 317, respectively. The sense amplifier 300 further includes second type of transistors (e.g., n-type field effect transistors (NFET)) 312 and 313 having drains coupled to the nodes 316 and 317 through isolation transistors 351 and 352, all respectively. Sources of the transistors 351 and 352 are coupled to the nodes 314 and 315 and drains of the transistors 351 and 352 are coupled to the nodes 316 and 317, all respectively. The nodes 316 and 317 may be referred to in a non-limiting manner as "gut nodes" for convenience. Respective gates of the transistors 310 and 312 are coupled to the node 317 and respective gates of the transistors 311 and 313 are coupled to the node 316. Sources of the transistors 310 and 311 are coupled to a power supply node ACT and sources of the transistors 312 and 313 are coupled to a power supply node RNL.

The drains of transistors 312 and 313 are also coupled to sense nodes 314 and 315, respectively. A digit line DL is coupled to the node 314 and a digit line DLb is coupled to the node 315. The digit line DL may represent digit line DL 220 of FIG. 2 and the digit line DLb may represent digit line DLb 221 in some embodiments of the disclosure.

The sense amplifier 300 further includes a transistor 318 having a drain and source coupled to nodes 316 and 317, respectively, and includes a precharge transistor 319 coupled to node 317. However, the transistor 319 may have a drain coupled to either or both nodes 316 and 317 without departing from the scope of the disclosure. The transistor 319 provides a voltage from its source to node 317 when activated by an active control signal BLP (e.g., high logic level). In some embodiments of the disclosure, the voltage VBLP is provided to the node 317 when the transistor 319 is active. When activated by an active control signal BLEQ (e.g., high logic level), the transistor 318 provides a conductive path between the nodes 316 and 317 to equalize the respective node voltages. In some embodiments of the disclosure, the voltage VBLP 0.4V.

The transistors 310 and 311 are shown as PFETs and the transistors 312, 313, 318, 319, 351, and 352 are shown as NFETs in FIG. 3. However, one or more of the transistors may be changed to a different type, to a different transistor, to a different circuit without departing from the scope of the disclosure.

As will be described below, the sense amplifier 300 may provide threshold voltage compensation. The sense amplifier 300 may provide advantageous over conventional sense amplifiers providing threshold voltage compensation. For example, the sense amplifier 300 may include fewer circuit components (e.g., transistors) in comparison to such other sense amplifier designs. As a result, the sense amplifier 300, as well as other sense amplifiers according to embodiments of the disclosure, may provide a more compact circuit design and have less circuit complexity.

An example operation of the sense amplifier 300 according to an embodiment of the disclosure will be described with reference to FIGS. 4A and 4B, 5A and 5B, 6A and 6B, and 7A and 7B.

Figure 4A:
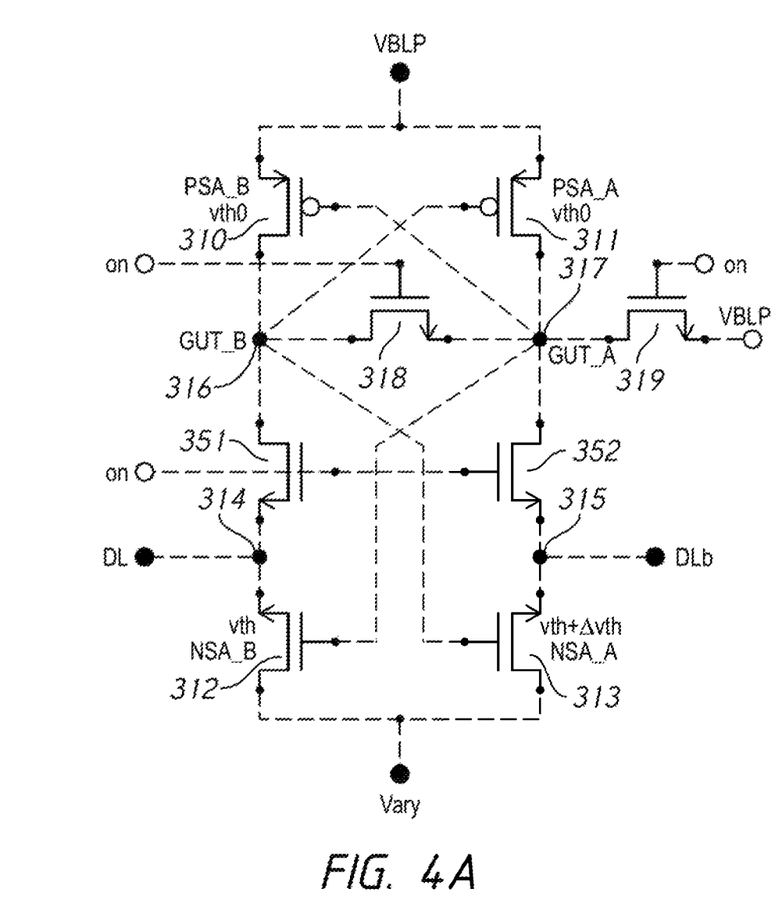
FIG. 4A is a schematic diagram of the sense amplifier of FIG. 3
Figure 4B:
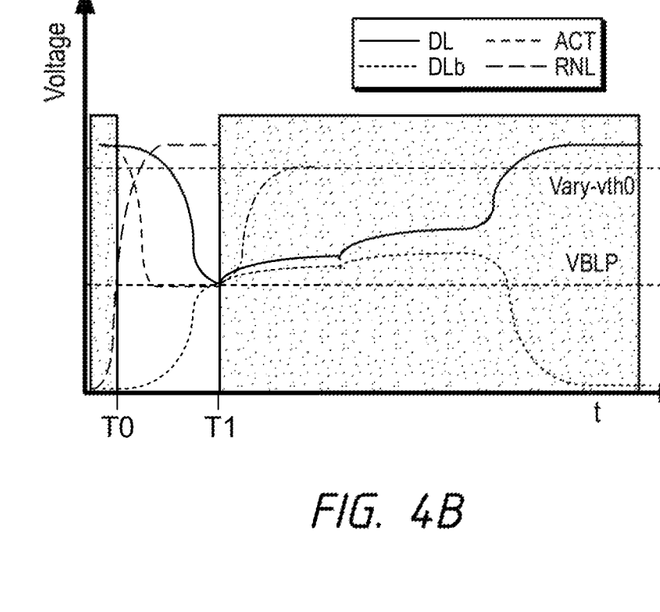
FIG. 4B is a timing diagram of various signals, both during operation of the sense amplifier of FIG. 3 according to an embodiment of the disclosure.

In the example operation, it is assumed that the transistors 312 and 313 should be matched and have a same threshold voltage vth, except that the transistor 313 actually has a threshold voltage of (vth+Δvth), that is, a threshold voltage that deviates from the threshold voltage vth by Δvth. In some embodiments of the disclosure, the threshold voltage vth of the transistors is 0.25V FIG. 4A is a schematic diagram of the sense amplifier 300 and FIG. 4B is a timing diagram of various signals, both during operation of the sense amplifier 300 according to an embodiment of the disclosure.

Prior time T0, the digit lines DL and DLb are at complementary voltage levels (e.g., one digit line at high voltage level, such as Vary, and the other digit line at a low voltage level, such as vss), the power supply node ACT is provided a high voltage level, and the power supply node RNL is provided a low voltage level. In some embodiments of the disclosure, the voltage Vary may be 1.0V.

Following time T0, the transistor 319 is activated by an active control signal BLP to provide a voltage VBLP to node 317. The control signal ISO also changes to an active level to activate the transistors 351 and 352 to form a conductive path between the sense nodes 314 and 315 and the nodes 316 and 317, respectively. The control signal BLEQ is an active level to activate the transistor 318 to form a conductive path between the nodes 316 and 317. Thus, with the ISO and BLEQ signals active, the nodes 314, 315, 316, and 317 have the same voltage level, namely, the voltage VBLP provided by the active transistor 319. Also following time T0, a voltage provided to the power supply node ACT changes from the high voltage level to the VBLP voltage and a voltage provided to the power supply node RNL changes from the low voltage level to the high voltage level, such as Vary. As a result, by time T1 the digit lines DL and DLb (which are coupled to nodes 314 and 315, respectively) change from complementary voltage levels to the VBLP voltage. Additionally, the gate and drain of the transistor 312 are coupled together and the gate and drain of the transistor 313 are coupled together through activated transistors 351, 352, and 318, and thus, the transistors 312 and 313 are effectively diode coupled.

The operation between times T0 and T1 may be referred to as a precharge phase.

Figure 5A:
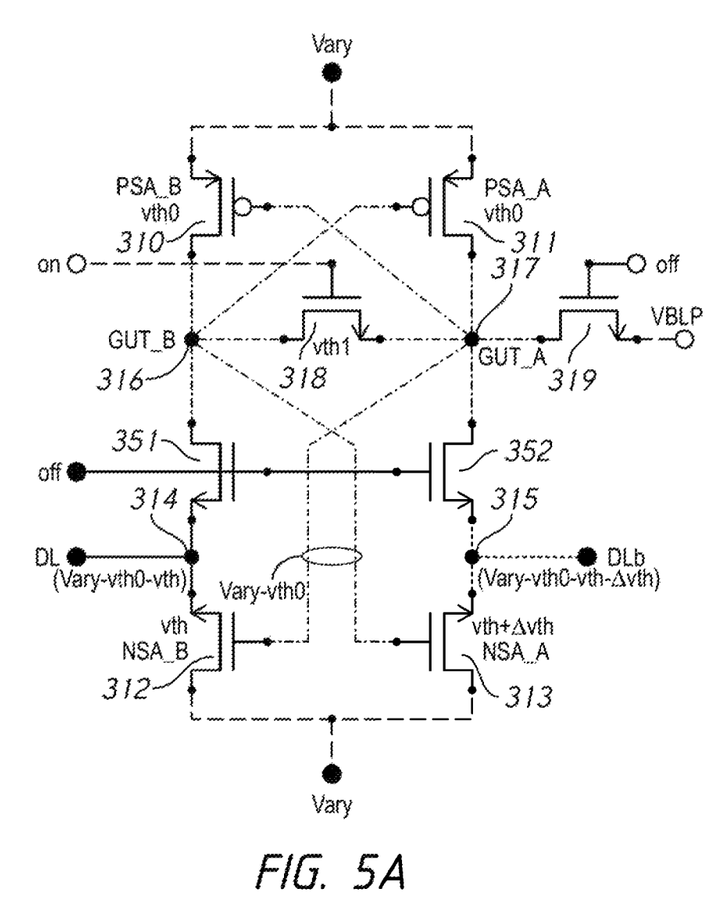
FIG. 5A is a schematic diagram of the sense amplifier of FIG. 3
Figure 5B:
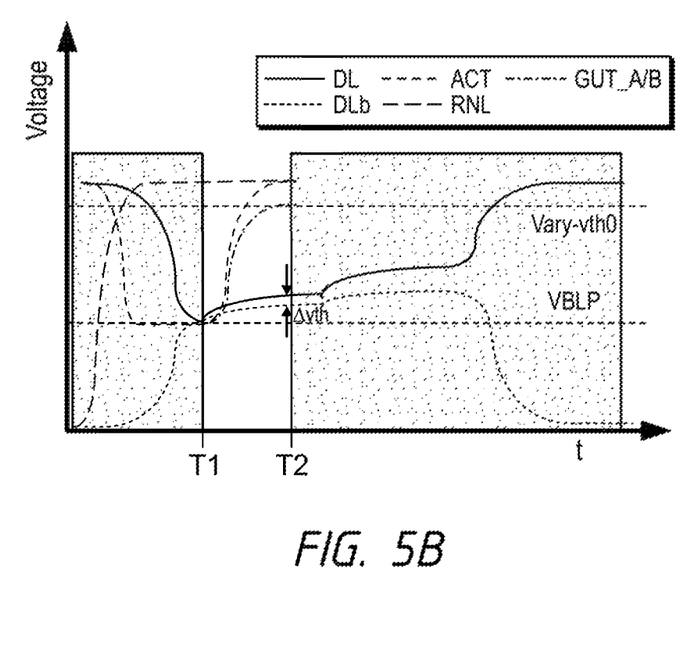
FIG. 5B is a timing diagram of various signals, both during operation of the sense amplifier of FIG. 3 according to an embodiment of the disclosure.

FIG. 5A is a schematic diagram of the sense amplifier 300 and FIG. 5B is a timing diagram of various signals, both during operation of the sense amplifier 300 according to an embodiment of the disclosure.

Following time T1, the transistor 319 is deactivated by an inactive BLP signal to no longer provide the voltage VBLP to the node 317. The control signal ISO also changes to an inactive level to deactivate the transistors 351 and 352 to no longer provide a conductive path between the sense nodes 314 and 315 and the nodes 316 and 317, respectively. Also following time T1, the voltage provided to the power supply node ACT changes from the voltage VBLP to the high voltage level, for example, Vary. As a result, the nodes 314 and 315 are isolated from the nodes 316 and 317. Additionally, the voltage of nodes 316 and 317 changes due to the Vary voltage provided to the power supply node ACT and the transistor 319 no longer providing the voltage VBLP to the node 317. The voltage of the nodes 316 and 317 changes to (Vary−vth0), where vth0 is the threshold voltage of the transistors 310 and 311, due to a voltage drop across the transistors 310 and 311. It is assumed for the example that a threshold voltage vth0 of the transistors 310 and 311 is greater than a threshold voltage vth1 of the transistor 318. In some embodiments of the disclosure, the threshold voltage vth0 is 0.25V.

With the nodes 316 and 317 at a voltage (Vary−vth0), and recalling that nodes 316 and 317 are coupled to the gates of transistors 313 and 312, respectively, a voltage at node 314 and a voltage at node 315 both change. By time T2, a difference between the respective voltages at nodes 314 and 315 develops. With the power supply node RNL provided the high voltage level, such as Vary, the voltage at node 314 is the gate voltage less the threshold voltage of the transistor 312 (vth) and the voltage at node 315 is the gate voltage less the threshold voltage of the transistor 313 (vth+Δvth). The resulting voltage at node 314 is [(Vary−vth0)−vth] and the resulting voltage at node 315 is [(Vary−vth0)−(vth+Δvth)]. The voltage at node 314 may be rewritten as (Vary−vth0−vth) and the voltage at node 315 may be rewritten as (Vary−vth0−vth−Δvth). The resulting voltages at nodes 314 and 315 causes the voltages of the digit lines DL and DLb, respectively, to change. In the present example operation, the voltage of digit line DL is greater than the voltage of digit line DLb (e.g., the voltage of node 314 is greater than the voltage of node 315) by the voltage difference of nodes 314 and 315, for example, Δvth.

A difference between the respective voltages of nodes 314 and 315 (e.g., Δvth) may represent a threshold voltage offset between the threshold voltages of the transistors 312 and 313. By developing the respective voltages at nodes 314 and 315, threshold voltage compensation (e.g., for the transistors 312 and 313) may be provided.

The operation between times T1 and T2 may be referred to as a threshold voltage compensation (vtc) phase.

Figure 6A:
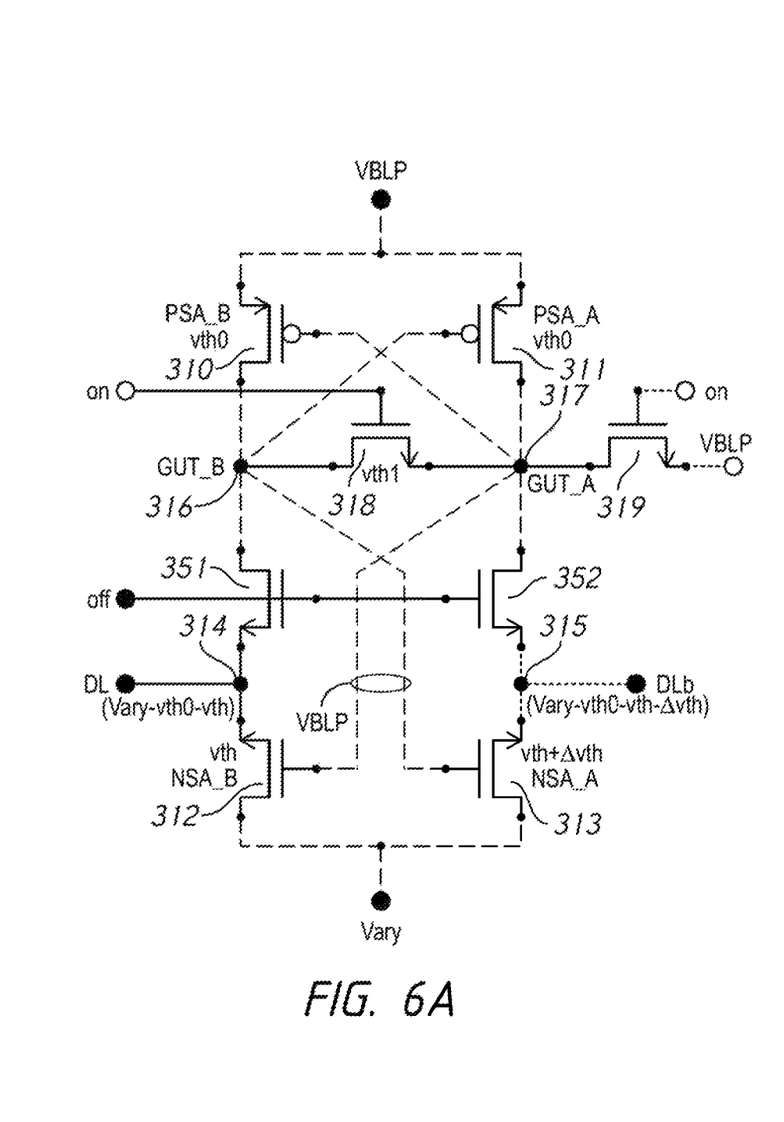
FIG. 6A is a schematic diagram of the sense amplifier of FIG. 3
Figure 6B:
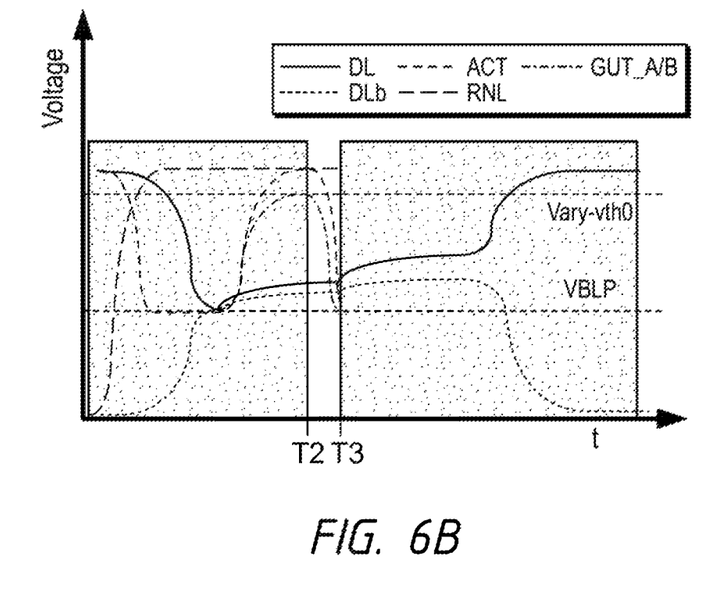
FIG. 6B is a timing diagram of various signals, both during operation of the sense amplifier of FIG. 3 according to an embodiment of the disclosure.

FIG. 6A is a schematic diagram of the sense amplifier 300 and FIG. 6B is a timing diagram of various signals, both during operation of the sense amplifier 300 according to an embodiment of the disclosure.

With reference to FIGS. 6A and 6B, following time T2, the transistor 319 may again be activated to provide the voltage VBLP to the node 317. The voltage provided to the power supply node ACT may also change from the high voltage level to the voltage VBLP. With the transistor 318 still activated to provide a conductive path between nodes 316 and 317, the voltage at nodes 316 and 317 may change to the voltage VBLP by time T3. Note that the respective voltages at nodes 314 and 315 do not change with the change in voltage at nodes 316 and 317. Thus, the difference in respective voltages remains at nodes 316 and 317 for threshold voltage compensation.

The operation between times T2 and T3 may be referred to as a gut node equalization phase. The operation between times T2 and T3 is optional, and it is not necessary for the nodes 316 and 317 to be equalized in order for the sense amplifier 300 to provide threshold voltage compensation or for the sense amplifier 300 to operate during an access operation. The equalization operation may provide an advantage by setting the voltages of nodes 316 and 317 to a known, and common voltage level. However, the equalization operation adds time (e.g., from time T2 to time T3) to the overall access operation. In some embodiments of the disclosure a gut node equalization operation is not included, for example, as previously described between times T2 and T3.

Figure 7A:
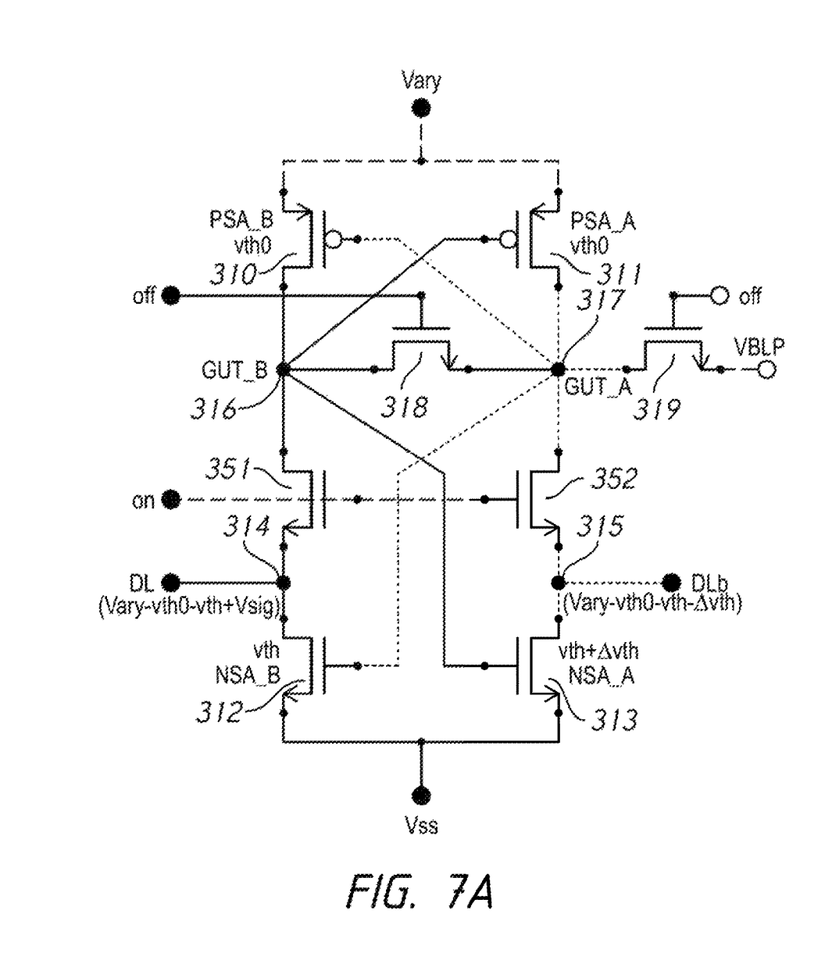
FIG. 7A is a schematic diagram of the sense amplifier of FIG. 3
Figure 7B:
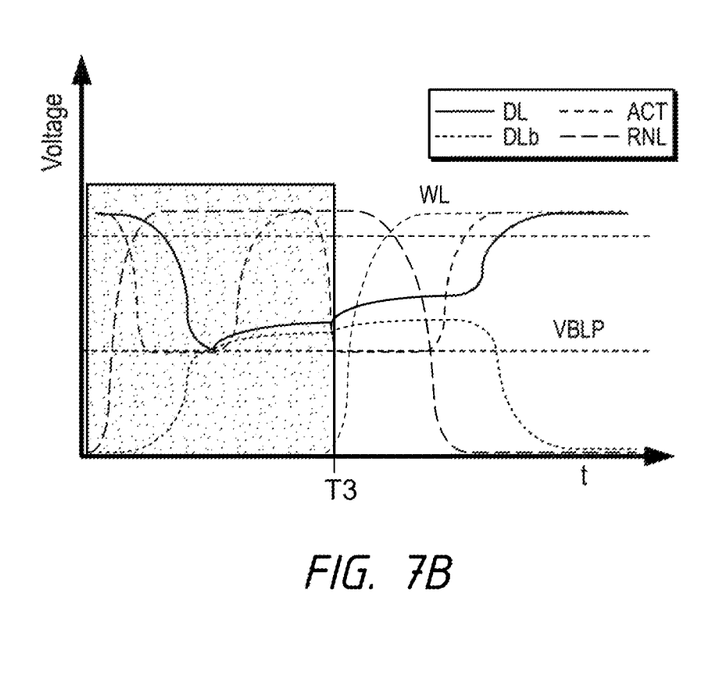
FIG. 7B is a timing diagram of various signals, both during operation of the sense amplifier of FIG. 3 according to an embodiment of the disclosure.

FIG. 7A is a schematic diagram of the sense amplifier 300 and FIG. 7B is a timing diagram of various signals, both during operation of the sense amplifier 300 according to an embodiment of the disclosure.

Following time T3, the transistor 318 is deactivated by an inactive BLEQ signal, and a conductive path between the nodes 316 and 317 is no longer provided through the transistor 318. The transistor 319 is also deactivated by an inactive BLP signal to no longer provide the voltage VBLP to the node 317. The control signal ISO also changes to an active level to activate the transistors 351 and 352 to form a conductive path between the nodes 314 and 315 and the nodes 316 and 317, respectively. The conductive paths allow the voltages of the nodes 314 and 315 (which reflect the voltage difference due to threshold voltage offset) to be shared with the voltages of 316 and 317, respectively. As a result, the voltages of the nodes 316 and 317 now also reflect a voltage difference, which in effect provides threshold voltage compensation for the sense amplifier 300. The voltages of the nodes 316 and 317 are now biased accordingly to compensate for a threshold voltage offset.

An access line WL may be activated (e.g., changed to a high voltage level) following time T3 to couple a memory cell to the digit line DL or to the digit line DLb, for example, as previously described with reference to FIG. 2. The memory cell coupled to the digit line DL or DLb causes a voltage change on the respective digit line based on the data state stored by the memory cell. For example, the memory cell may cause the voltage of the respective digit line to increase when the stored data state corresponds to the memory cell storing a positive charge. The change in the respective digit line DL or DLb from the memory cell is reflected on the corresponding node 314 or 315. The resulting voltage is combined with any voltage at node 316 and 317 developed for threshold voltage compensation.

Also following time T3, a voltage provided to the power supply node RNL changes from the high voltage level to the low voltage level, such as vss and a voltage provided to the power supply node ACT changes from the VBLP voltage to the high voltage level. Changing the voltages provided to the RNL node and the ACT node causes the sense amplifier 300 to amplify a voltage difference at the nodes 314 and 315, which is also present at nodes 316 and 317 due to the activated transistors 351 and 352, all respectively. As a result, following the voltage change to the RNL and ACT nodes, the voltage difference between nodes 314/316 and 315/317 is amplified and the digit lines DL and DLb are driven to complementary voltages by the transistors 310, 311, 312, 313, which have respective gates coupled to the nodes 316 or 317.

In the example operation of FIGS. 7A and 7B, it is assumed that activation of the access line WL causes a memory cell to be coupled to the digit line DL, and the voltage of node 314 to be changed by a voltage Vsig. The voltage of node 314 changes to (Vary−vth0−vth+Vsig). The voltage of node 315 remains the same at (Vary−vth0−vth−Δvth). As a result of coupling the memory cell to the digit line DL in the present example, the voltage of digit line DL is higher than the voltage of digit line DLb, as shown in FIG. 7B.

The following equations provide an understanding of the voltages across the gate and source and across the drain and source of transistors 312 and 313.

$$NSA\_A{:}Vgs - Vth\_A = (Vary - vth0 - vth + Vsig) - (vth + \Delta vth)$$
$$= Vary - vth0 - 2vth - \Delta vth + Vsig$$
$$NSA\_A{:}Vds = Vary - vth0 - vth + Vsig(\text{saturation})$$
$$NSA\_B{:}Vgs - Vth\_B = (Vary - vth0 - vth - \Delta vth) - (vth)$$
$$= Vary - vth0 - 2vth - \Delta vth$$
$$= 1.0\ V - 0.25\ V - 0.5\ V - 0.03\ V$$
$$= \text{around } 0.22\ V(\text{strong inversion})$$
$$NSA\_B{:}Vds = Vary - vth0 - vth - \Delta vth(\text{saturation})$$

In the present example, when the voltages of the power supply nodes RNL and ACT change to the low and high voltage levels, respectively, the digit line DL is driven to the high voltage level and the digit line DLb is driven to the low voltage level. However, it will be understood that for other situations the digit line DLb may have a higher voltage than digit line DL following activation of the access line WL and the digit line DLb will be driven to the high voltage level and the digit line DL will be driven to the low voltage level when the sense amplifier is activated.

The operation following time T3 may be referred to as a sense amplifier activation phase. During the sense amplifier activation phase, a voltage difference between the nodes 314 and 315 due to a memory cell being coupled to a digit line DL or DLb is amplified to drive the digit lines DL and DLb to complementary voltage levels accordingly.

As shown by the example operation of FIG. 3 and FIGS. 4A-7B, threshold voltage compensation may be provided by the sense amplifier 300. The threshold voltage compensation may provide the advantage of more accurately sensing data states of memory cells when accessed.

The order of operation of activating/deactivating the transistors 318 and 319, activating/deactivating the transistors 351 and 352, activating/deactivating an access line WL, and changing the voltages at the power supply nodes RNL and ACT may be different than specifically shown and described in the example operation of FIG. 3 and FIGS. 4A-7B for different embodiments of the disclosure. Thus, the order of operation may change from the specific example operation without departing from the scope of the disclosure.

In the previous example, the voltage offset between the nodes 314 and 315 that provides threshold voltage compensation is developed by using the high voltage level Vary, which is a voltage that is also used, for example, along with the low voltage level vss during the sense amplifier activation phase to activate the sense amplifier. The gates of the transistors 312 and 313 are biased by self-biasing. Since the Vary voltage is already being provided as one of the sense amplifier activation voltages, a separate bias voltage is not needed for the threshold voltage compensation phase to develop the voltage offset between the nodes 314 and 315.

Another example operation of the sense amplifier 300 according to an embodiment of the disclosure will be described with reference to FIGS. 8A and 8B, 9A and 9B, 10A and 10B, and 11A and 11B.

Figure 8A:
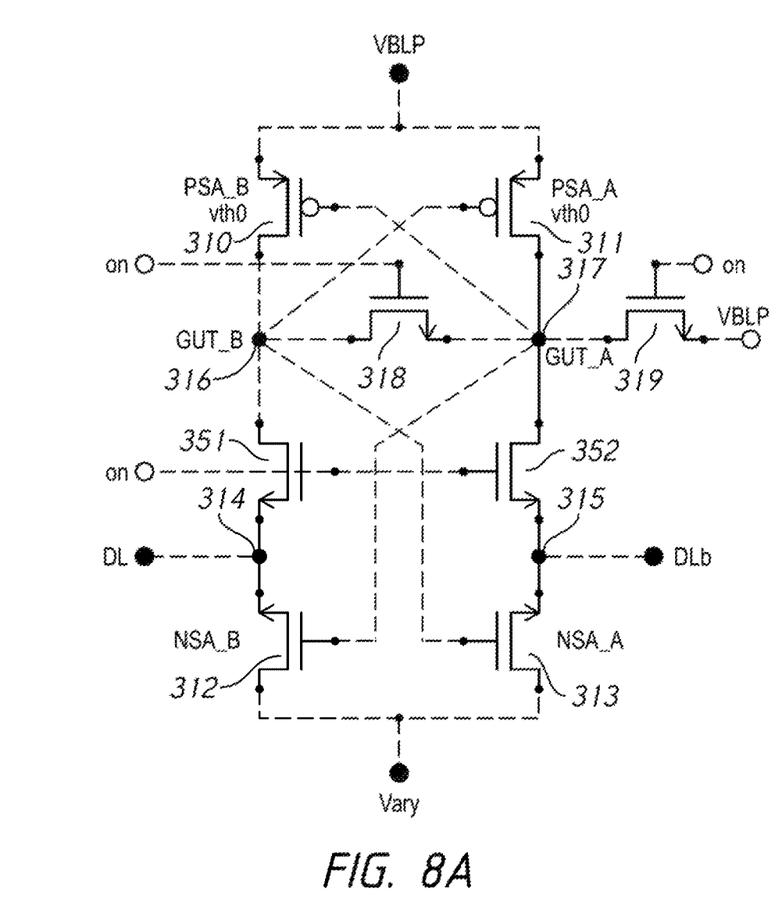
FIG. 8A is a schematic diagram of the sense amplifier of FIG. 3

In the example operation, it is assumed that the transistors 312 and 313 should be matched to have a same threshold voltage vth, except that the transistor 313 actually has a threshold voltage of (vth+Δvth), that is, a threshold voltage that deviates from the same threshold voltage vth by Δvth. In some embodiments of the disclosure, the threshold voltage vth of the transistors is 0.25V FIG. 8A is a schematic diagram of the sense amplifier 300 and FIG. 8B is a timing diagram of various signals, both during operation of the sense amplifier 300 according to an embodiment of the disclosure.

Figure 8B:
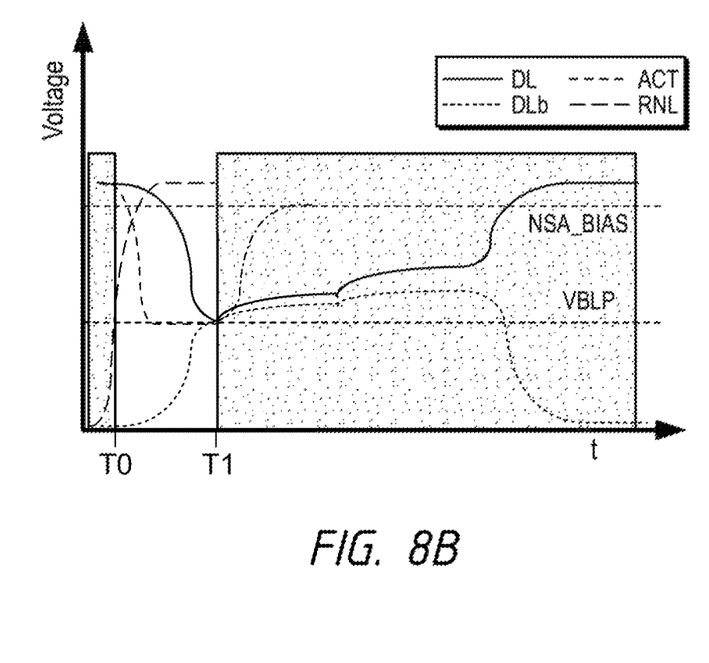
FIG. 8B is a timing diagram of various signals, both during operation of FIG. 3 according to an embodiment of the disclosure.

Operation between times T0 and T1 of FIG. 8B is similar to the precharge phase previously described with reference to times T0 and T1 of FIG. 4B. As such, a detailed description of operation between times T0 and T1 of FIG. 8B is omitted in the interest of brevity. In summary, by time T1 of FIG. 8B, the digit lines DL and DLb (which are coupled to nodes 314 and 315, respectively) are both at the VBLP voltage, and the power supply node ACT is provided the VBLP voltage and the power supply node RNL is provided the high voltage level Vary. Additionally, the gate and drain of the transistor 312 are coupled together and the gate and drain of the transistor 313 are coupled together through activated transistors 351, 352, and 318, and thus, the transistors 312 and 313 are effectively diode coupled.

As with the operation previously described with reference to FIGS. 4A and 4B, the operation described with reference to times T0 and T1 of FIGS. 8A and 8B may be referred to as a precharge phase.

Figure 9A:
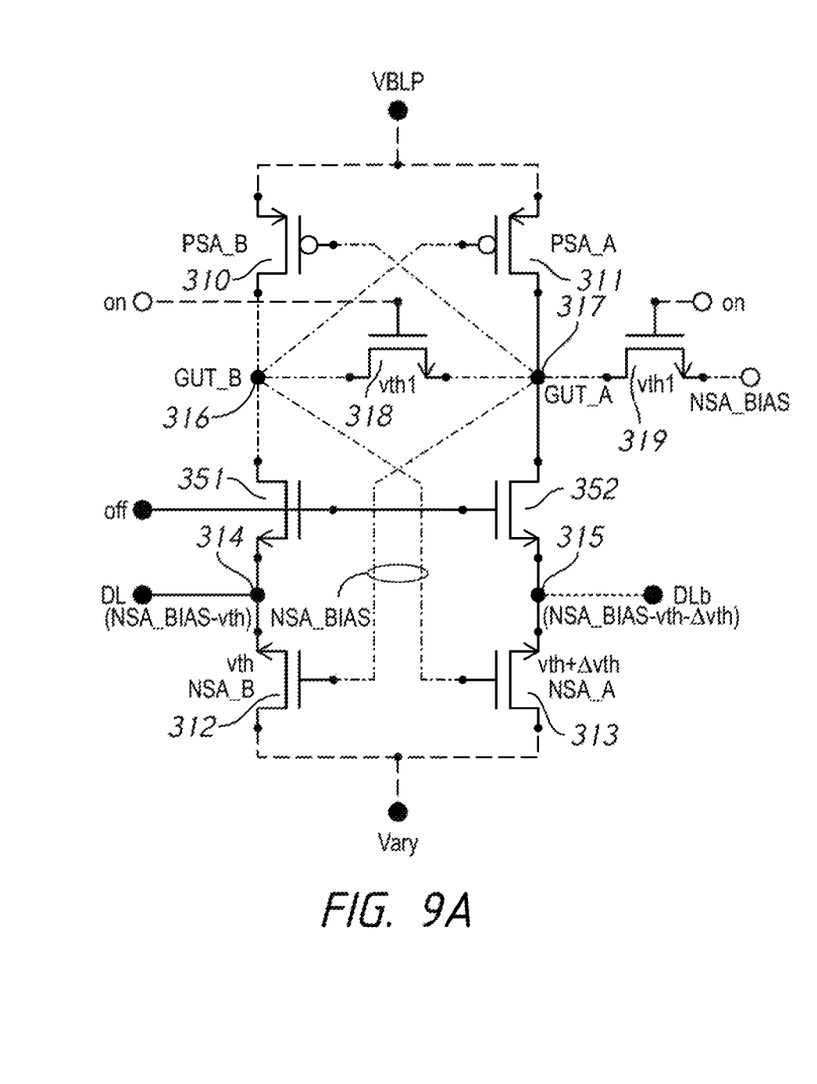
FIG. 9A is a schematic diagram of the sense amplifier of FIG. 3
Figure 9B:
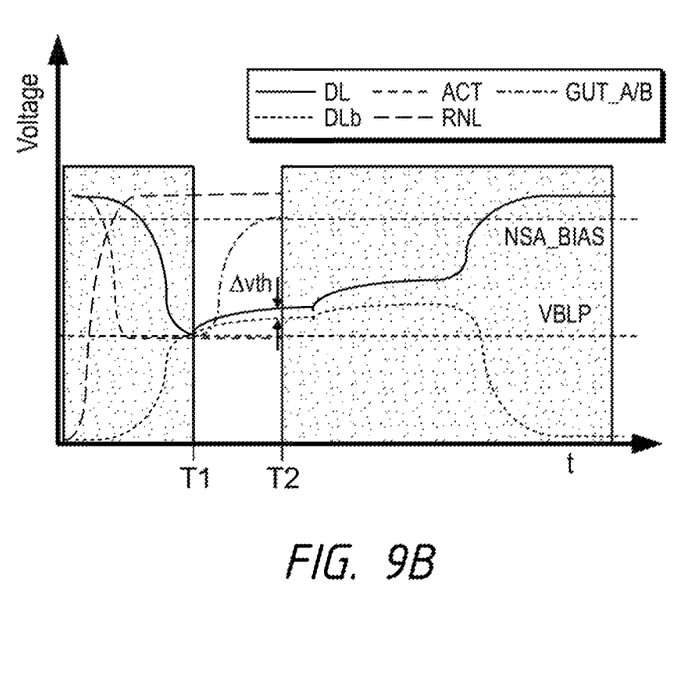
FIG. 9B is a timing diagram of various signals, both during operation of the sense amplifier of FIG. 3 according to an embodiment of the disclosure.

FIG. 9A is a schematic diagram of the sense amplifier 300 and FIG. 9B is a timing diagram of various signals, both during operation of the sense amplifier 300 according to an embodiment of the disclosure.

In contrast to FIGS. 5A and 5B previously described, voltage threshold compensation as will be described with reference to FIGS. 9A and 9B is provided by using a bias voltage NSA_BIAS (rather than the high voltage level Vary). The bias voltage NSA_BIAS may be provided separately from the high level voltage Vary, which is still used for activation of the sense amplifier, but is not used to bias gates of the transistors 312 and 313 for threshold voltage compensation.

With reference to FIGS. 9A and 9B, following time T1, the control signal ISO changes to an inactive level to deactivate the transistors 351 and 352 to no longer provide a conductive path between the sense nodes 314 and 315 and the nodes 316 and 317, respectively. In contrast to the example operation described with reference to FIG. 5B, the voltage provided to the power supply node ACT remains the voltage VBLP and the transistor 319 is activated by the active control signal BLP to provide a bias voltage NSA_BIAS to node 317. The node 316 is also provided the bias voltage NSA_BIAS through active transistor 318, which remains active from the active control signal BLEQ. In some embodiments of the disclosure, the bias voltage NSA_BIAS is less than (Vary−vth1−dvth1), where Vary is the high voltage level, vth1 is a threshold voltage for the transistor 318 and for the transistor 319, and dvth1 is any mismatch difference between the threshold voltages of transistors 318 and 319$_{[EK1]}$. As a result, transistors 310 and 311 are not conductive and the gates of the transistors 312 and 313 are provided the bias voltage NSA_BIAS. In some embodiments of the disclosure, the bias voltage NSA_BIAS is 0.75 V.

By time T2, a difference between the respective voltages at nodes 314 and 315 develops. With the power supply node RNL provided the high voltage level, such as Vary, and the bias voltage NSA_BIAS provided to gates of the transistors 312 and 313, the voltage at node 314 is the bias voltage NSA_BIAS less the threshold voltage of the transistor 312 (vth) and the voltage at node 315 is the bias voltage NSA_+BIAS less the threshold voltage of the transistor 313 (vth+Δvth). In particular, the resulting voltage at node 314 is (NSA_BIAS−vth) and the resulting voltage at node 315 is [NSA_BIAS−(vth+Δvth)]. The voltage at node 315 may be rewritten as (NSA_BIAS−vth−Δvth). The resulting voltages at nodes 314 and 315 causes the voltages of the digit lines DL and DLb, respectively, to change. In the present example operation, the voltage of digit line DL is greater than the voltage of digit line DLb (e.g., the voltage of node 314 is greater than the voltage of node 315) by the voltage difference of nodes 314 and 315, for example, Δvth.

A difference between the respective voltages of nodes 314 and 315 (e.g., Δvth) may represent an threshold voltage offset between the threshold voltages of the transistors 312 and 313. By developing the respective voltages at nodes 314 and 315, threshold voltage compensation for the transistors 312 and 313 may be provided.

As with the operation previously described with reference to FIGS. 5A and 5B, the operation between times T1 and T2 of FIGS. 9A and 9B may be referred to as a threshold voltage compensation (vtc) phase.

Figure 10A:
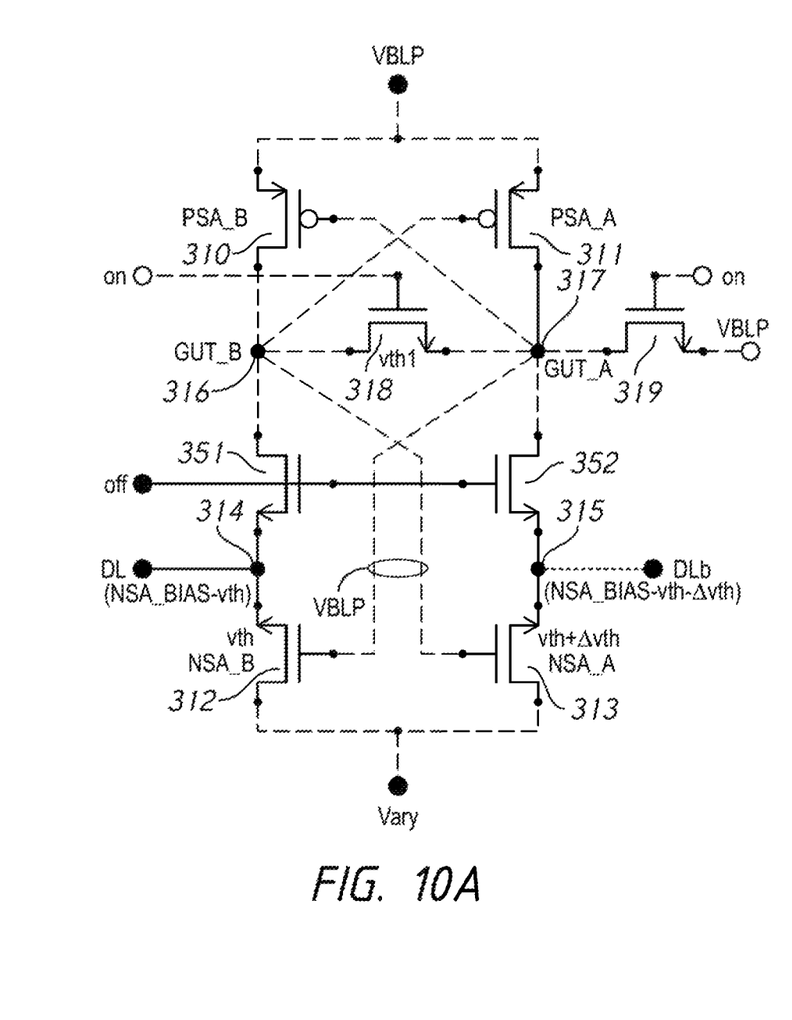
FIG. 10A is a schematic diagram of the sense amplifier of FIG. 3
Figure 10B:
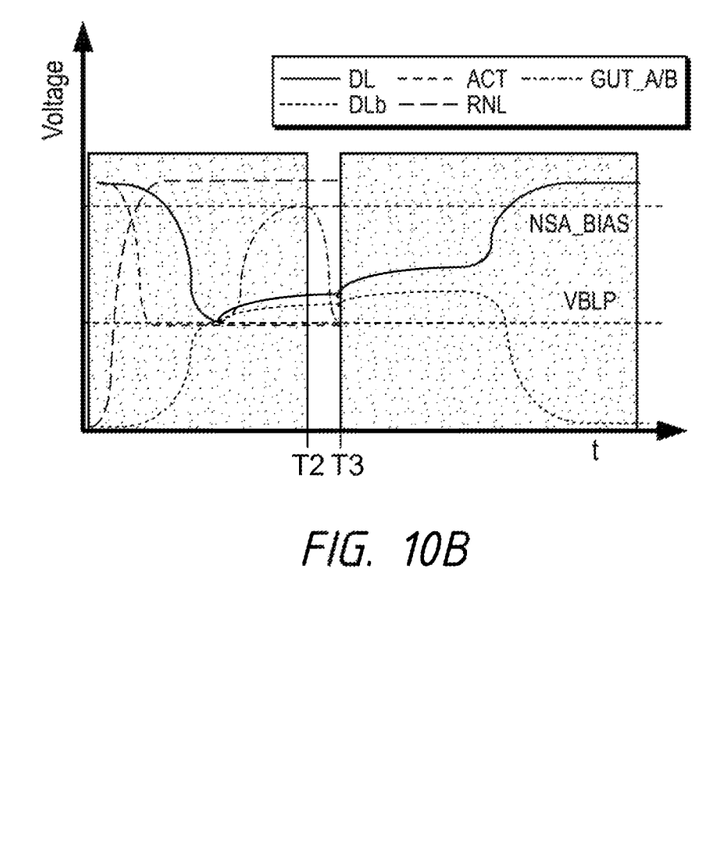
FIG. 10B is a timing diagram of various signals, both during operation of the sense amplifier of FIG. 3 according to an embodiment of the disclosure.

FIG. 10A is a schematic diagram of the sense amplifier 300 and FIG. 10B is a timing diagram of various signals, both during operation of the sense amplifier 300 according to an embodiment of the disclosure.

Operation between times T2 and T3 of FIG. 10B is similar to the gut node equalization phase previously described with reference to times T2 and T3 of FIG. 6B. As such, a detailed description of operation between times T2 and T3 of FIG. 10B is omitted in the interest of brevity. In summary, by time T3 of FIG. 10B, nodes 316 and 317 are equalized at the voltage VBLP.

As with the operation described with reference to times T2 and T3 of FIGS. 6A and 6B, the operation described with reference to times T2 and T3 of FIGS. 10A and 10B may be referred to as a gut node equalization phase. Similarly, the operation between times T2 and T3 of FIG. 10B is optional, and in some embodiments of the disclosure, the nodes 316 and 317 are not equalized to the voltage VBLP to provide threshold voltage compensation for the sense amplifier 300 to operate during an access operation.

Figure 11A:
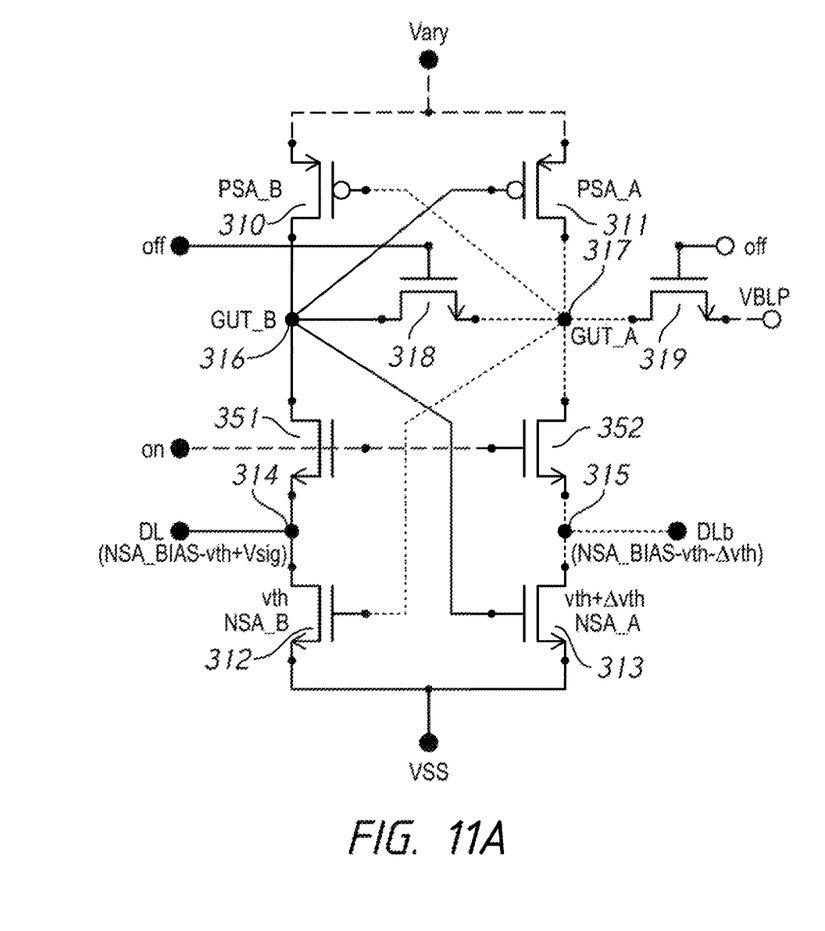
FIG. 11A is a schematic diagram of the sense amplifier of FIG. 3
Figure 11B:
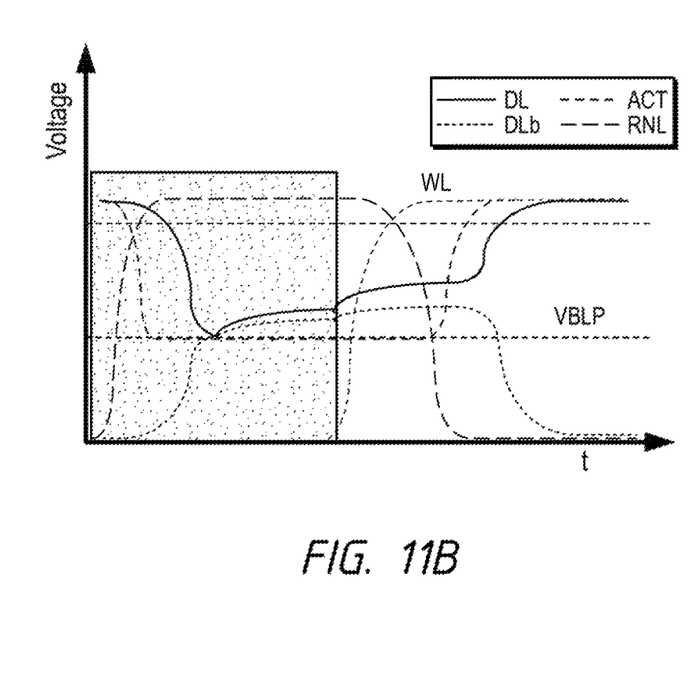
FIG. 11B is a timing diagram of various signals, both during operation of the sense amplifier of FIG. 3 according to an embodiment of the disclosure.

FIG. 11A is a schematic diagram of the sense amplifier 300 and FIG. 11B is a timing diagram of various signals, both during operation of the sense amplifier 300 according to an embodiment of the disclosure.

Operation following time T3 of FIG. 11B is similar to the sense amplifier activation phase previously described with reference to time T3 of FIG. 78. As such, a detailed description of operation following time T3 of FIG. 11B is omitted in the interest of brevity.

In summary, following time T3 of FIG. 11B, the voltages of nodes 314 and 315 are shared with nodes 316 and 317 through activated transistors 351 and 352, all respectively, so that the respective voltages of nodes 316 and 317 are biased accordingly to compensate for a threshold voltage offset. Additionally, an access line WL is activated to couple a memory cell to digit line DL or DLb. As previously described, with reference to FIG. 78, the sense amplifier is activated by providing the high voltage level Vary to the power supply node ACT and providing the low voltage level vss to the power supply node RNL. The activated sense amplifier amplifies a voltage difference between nodes 314/316 and 315/317 and the digit lines DL and DLb are driven to complementary voltages accordingly.

In the example operation of FIGS. 11A and 11B, as it was for the example operation of FIGS. 7A and 7B, it is assumed the activation of the access line WL causes a memory cell to be coupled to the digit line DL, and the voltage of node 314 is changed by a voltage Vsig. The voltage of node 314 changes to (NSA_BIAS−vth+Vsig). The voltage of node 315 remains the same at (NSA_BIAS−vth−Δvth). As a result of coupling the memory cell to the digit line DL in the present example, the voltage of digit line DL is higher than the voltage of digit line DLb.

The following equations provide an understanding of the voltages across the gate and source and across the drain and source of transistors 312 and 313.

$$NSA\_A: Vgs - Vth\_A = (NSA\_BIAS - vth + Vsig) - (vth + \Delta vth)$$
$$= NSA\_BIAs - 2vth - \Delta vth + Vsig$$
$$NSA\_A: Vds = NSA\_BIAS - vth + Vsig \text{(saturation)}$$
$$NSA\_B: Vgs - Vth\_B = (NSA\_BIAS - vth - \Delta vth) - (vth)$$
$$= NSA\_BIAS - 2vth - \Delta vth$$
$$= 0.75\ V - 0.5\ V - 0.03\ V$$
$$= \text{around } 0.22\ V \text{(strong inversion)}$$
$$NSA\_B: Vds = NSA\_BIAS - vth - \Delta vth \text{(saturation)}$$

Once activated, the sense amplifier 300 amplifies the voltage difference to drive the digit line DL to the high voltage level and the digit line DLb to the low voltage level. However, it will be understood that this is an example and that for other situations the digit line DLb may have a higher voltage than digit line DL following activation of the access line WL and the digit line DLb will be driven to the high voltage level and the digit line DL will be driven to the low voltage level.

As with the operation previously described with reference to FIGS. 7A and 7B, the operation following time T3 described with reference to FIGS. 11A and 11B may be referred to as a sense amplifier activation phase.

As shown by the example operation of FIG. 3 and FIGS. 8A-11B, threshold voltage compensation may be provided by the sense amplifier 300. The threshold voltage compensation may provide the advantage of more accurately sensing data states of memory cells when accessed.

The order of operation of activating/deactivating the transistors 318 and 319, activating/deactivating the transistors 351 and 352, activating/deactivating an access line WL, and changing the voltages at the power supply nodes RNL and ACT may be different than specifically shown and described in the example operation of FIG. 3 and FIGS. 8A-11B for different embodiments of the disclosure. Thus, the order of operation may change from the specific example operation without departing from the scope of the disclosure.

In the previous example described with reference to FIG. 3 and FIGS. 8A-11B, the voltage offset between the nodes 314 and 315 that provides threshold voltage compensation is developed by using the bias voltage NSA_BIAS. Although provision of the bias voltage NSA_BIAS may require providing a voltage separate from the high voltage level Vary, providing the bias voltage NSA_BIAS for threshold voltage compensation may be advantageous by allowing greater control of the resulting voltage offset developed at nodes 314 and 315 during the threshold voltage compensation phase.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a first transistor including a first source coupled to a first power supply node, a first drain coupled to a first node, and a first gate coupled to a second node;
a second transistor including a second source coupled to the first power supply node, a second drain coupled to the second node, and a second gate coupled to the first node;
a third transistor including a third source coupled to a second power supply node, a third drain coupled to a third node, and a third gate coupled to the second node;
a fourth transistor including a fourth source coupled to the second power supply node, a fourth drain coupled to a fourth node, and a fourth gate coupled to the first node;
a fifth transistor including a fifth source coupled to the third node, a fifth drain coupled to the first node, and a fifth gate configured to receive first control signal;
a sixth transistor including a sixth source coupled to the fourth node, a sixth drain coupled to the second node, and a sixth gate configured to receive the first control signal;
a seventh transistor including a seventh source coupled to the second node, a seventh drain coupled to the first node, and a seventh gate configured to receive a second control signal; and
an eighth transistor including an eighth source configured to receive a voltage, an eighth drain coupled to at least one of the first or second nodes, and an eighth gate configured to receive a third control signal.

2. The apparatus of claim 1 wherein the third node is further coupled to a first digit line and the fourth node is further coupled to a second digit line.

3. The apparatus of claim 1 wherein the first and second transistors comprise p-type field effect transistors and wherein the third and fourth transistors comprise n-type field effect transistors.

4. The apparatus of claim 3 wherein the fifth, sixth, seventh, and eighth transistors comprise n-type field effect transistors.

5. The apparatus of claim 1 wherein the voltage provided to the eighth source is less than a high level voltage and greater than a low level voltage, wherein the high level voltage is provided to the first power supply node and the low level voltage is provided to the second power supply during activation.

6. The apparatus of claim 1 wherein threshold voltages for the third and fourth transistors are different by an offset.

7. An apparatus, comprising:
first, second, and third transistors series coupled between a first power supply node and a second power supply node;
fourth, fifth, and sixth transistors series coupled between the first power supply node and the second power supply node;
a seventh transistor coupled to a first node between the first and second transistors, and to a second node between the fourth and fifth transistors; and
an eighth transistor coupled to at least one of the first and second nodes,
wherein gates of the first and third transistors are coupled to the second node and gates of the fourth and sixth transistors are coupled to the first node.

8. The apparatus of claim 7 wherein the second, fifth, seventh, and eighth transistors are activated during a precharge phase, wherein the seventh transistor is activated and the second, fifth, and eighth transistors are not activated during a threshold voltage compensation phase, and wherein the second and fifth transistors are activated and the seventh and eighth transistors are not activated during an activation phase.

9. The apparatus of claim 8 wherein the seventh and eighth transistors are activated and the second and fifth transistors are not activated during an equalization phase between the threshold voltage compensation phase and the activation phase.

10. The apparatus of claim 7 wherein the second, fifth, seventh, and eighth transistors are activated during a precharge phase, wherein the seventh and eighth transistors are activated and the second and fifth transistors are not activated during a threshold voltage compensation phase, and wherein the second and fifth transistors are activated and the seventh and eighth transistors are not activated during an activation phase.

11. The apparatus of claim 10 wherein the first power supply node is configured to receive a high voltage level and the second power supply node is configured to receive a low voltage level during the activation phase.

12. The apparatus of claim 7 wherein the first and fourth transistors a first transistor type and the second, third, fifth, sixth, seventh, and eighth transistors are a second transistor type.

13. A method, comprising:
precharging first and second gut nodes and first and second sense nodes of a sense amplifier to a precharge voltage, wherein first and second transistors are coupled to the first and second sense nodes, respectively;
deactivating a first isolation transistor coupled to the first gut node and the first sense node and deactivating a second isolation transistor coupled to the second gut node and the second sense node to isolate the first and second sense nodes from the first and second gut nodes, respectively; and
changing a voltage of the first and second gut nodes from the precharge voltage to bias the second and first transistors, respectively, wherein the second and first transistors are biased to develop respective voltages at the second and first sense nodes, respectively,
wherein the respective voltages at the second and first sense nodes are based on respective threshold voltages of the second and first transistors.

14. The method of claim 13 wherein a difference between the respective voltages of the second and first sense nodes is equal to a difference between the respective threshold voltages of the second and first transistors.

15. The method of claim 13, further comprising activating a transistor coupled to the first and second gut nodes to equalize the first and second gut nodes.

16. The method of claim 13 wherein the voltage of the first and second gut nodes is changed from the precharge voltage to a higher voltage.

17. The method of claim 16 wherein the voltage of the first and second gut nodes is changed to the higher voltage by self-biasing.

18. The method of claim 16 wherein the voltage of the first and second gut nodes is changed to the higher voltage by providing a bias voltage to at least one of the first and second gut nodes.

19. The method of claim 13, further comprising:
changing a voltage of at least one of the first and second sense nodes;
activating the first and second isolation transistors to provide a conductive path between the first and second gut nodes and the first and second sense nodes, all respectively; and
activating the sense amplifier to amplify a voltage difference between the first and second sense nodes.

20. The method of claim 19 wherein changing the voltage of at least one of the first and second sense nodes comprises coupling a memory cell to a digit line coupled to one of the first and second sense nodes.

* * * * *